(12) United States Patent
Hargreaves

(10) Patent No.: US 7,151,370 B1
(45) Date of Patent: Dec. 19, 2006

(54) QUADRATIC SPECIES SEPARATION USING BALANCED SSFP MRI

(75) Inventor: Brian A. Hargreaves, San Francisco, CA (US)

(73) Assignee: The Trustees of the Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 11/321,770

(22) Filed: Dec. 28, 2005

(51) Int. Cl.
*G01V 3/00* (2006.01)
(52) U.S. Cl. ........................ 324/307; 324/309
(58) Field of Classification Search ............... 324/307, 324/309
See application file for complete search history.

(56) References Cited

U.S. PATENT DOCUMENTS 6,307,368 B1* 10/2001 Vasanawala et al. ........ 324/309

6,856,134 B1* 2/2005 Reeder et al. ............... 324/309
6,922,054 B1* 7/2005 Hargreaves et al. ........ 324/307

OTHER PUBLICATIONS

Brian A. Hargreaves, "Quadratic Fat-Water Separation in Balanced-SSFP," 1005 ISMRM, Miami, Apr. 1, 2005.
Brian A. Hargreaves, "Quadratic Fat/Water Separation in Balanced SSFP," Unpublished as of Jun 9, 2006.

* cited by examiner

*Primary Examiner*—Louis M Arana
(74) *Attorney, Agent, or Firm*—Beyer Weaver & Thomas LLP

(57) ABSTRACT

MRI signals from two species such as water and fat are separated by using two SSFP acquisitions ($S_1$, $S_2$) with the two species signals having two different phase differences (e.g., 180°, 90°) and binomial quadratic expansion in which the species are determined based on magnitude and sign of $S_1$ and the magnitude of $S_2$.

12 Claims, 8 Drawing Sheets

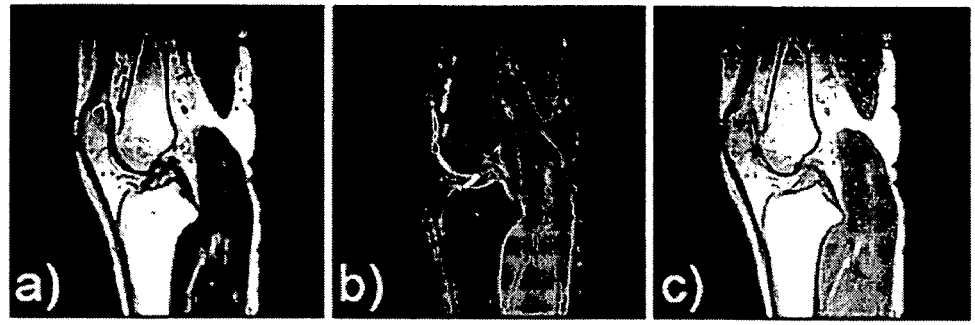
FIG. 7a  FIG. 7b  FIG. 7c
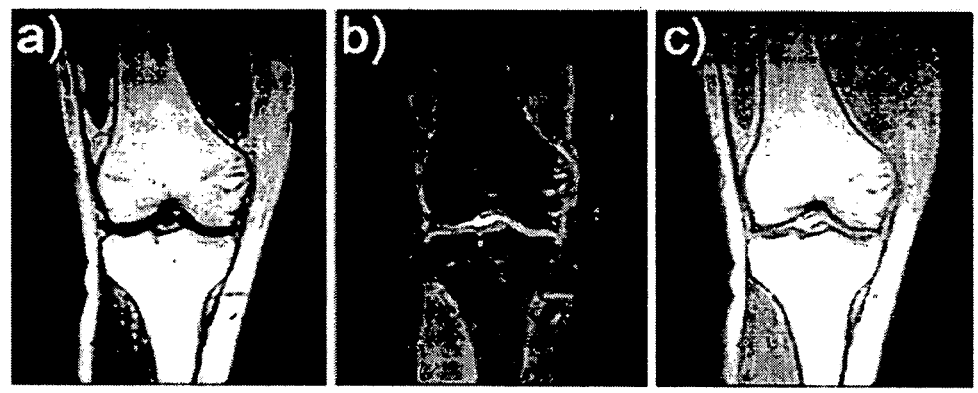
FIG. 8a  FIG. 8b  FIG. 8c

QUADRATIC SPECIES SEPARATION USING BALANCED SSFP MRI

GOVERNMENT RIGHTS

The U.S. government has rights in the disclosed invention pursuant to NIH grants to Stanford University including NIH Grants No. 5R01HL075803-02, 5R01HL067161-02, and 5R01EB0025524-02.

BACKGROUND OF THE INVENTION

This invention relates generally to magnetic resonance imaging (MRI), and more particularly the invention relates to species (e.g. water/fat) signal separation in MRI.

Magnetic resonance (MR) imaging is based on nuclear spins, which can be viewed as vectors in a three-dimensional space. During a MR experiment, each nuclear spin responds to four different effects—precession about the main magnetic field, nutation about an axis perpendicular to the main field, and both transverse and longitudinal relaxation. In steady-state MR experiments, a combination of these effects occurs periodically.

Refocused steady-state free precession (SSFP) sequences have recently gained popularity in magnetic resonance imaging, due to improved gradient hardware. SSFP imaging provides high signal and good contrast in short scan times.

As illustrated in FIGS. 1A, 1B, a refocused SSFP sequence includes a single RF excitation which is repeated periodically. All gradients used for slice selection or imaging are fully rewound over each repetitive time, TR. In the steady-state, the magnetization at points a and d is the same.

Magnetization is tipped about a traverse axis through an angle $\alpha$. Between excitations, the magnetization undergoes a precession by an angle $\theta=2\pi\Delta f TR$ about the z-axis (direction of B0), where $\Delta f$ is the tissue off-resonance, and also experiences both T1 and T2 relaxation.

During the sequence each spin is affected by RF pulses, relaxation and free precession. The steady-state magnetization for SSFP is a function of the sequence parameters flip angle ($\alpha$), repetition time (TR) and echo time (TE) as well as the tissue parameters T1, T2, and resonant frequency shift $\Delta f$.

Balanced steady-state free precession (SSFP) imaging sequences offer relatively high signal and rapid 2D or 3D imaging, potentially overcoming two of the prime weaknesses of MR imaging.

However, clinical applications of balanced SSFP are still limited by two main factors. First, the signal is very sensitive to resonant frequency variations that result from static field inhomogeneity, susceptibility variations or chemical shift. Second, balanced SSFP produces a very bright signal from fat which obscures visualization of other structures.

Numerous methods have been presented to suppress the fat signal including methods that generate a fat suppressed steady state, methods that synthesize a fat-suppressed steady state, and methods with transient fat suppression. Alternatively, several methods separate fat and water using multiple acquisitions, or in a single acquisition.

These methods all have advantages and disadvantages when used with balanced SSFP imaging with regard to efficiency, scan time, robustness and accuracy. Many require multiple acquisitions or increased scan time. As a consequence, most methods compromise the SNR efficiency of balanced SSFP. The only exceptions all can fail when fat and water occupy a single voxel. Thus there is still a trade off that must be made when selecting an imaging sequence for a particular application. Furthermore, most of these techniques still need to be compared quantitatively and in a clinical setting.

Dixon SSFP imaging offers high image quality but requires three or more signal acquisitions with varying echo times and a challenging reconstruction.

There are numerous variations of Dixon imaging. Two applications of Dixon fat/water separation with balanced SSFP are IDEAL (iterative decomposition of water and fat using echo asymmetry and least squares estimation) which uses an iterative reconstruction that maintains efficiency by permitting the use of small echo spacings and the in-phase/out-of-phase 2-point approach that is essentially a variation of the linear combination technique. The former of these techniques provides accurate quantitation of fat and water within a voxel. The latter technique requires only 2 acquisitions, but compromises accuracy. A final "Dixon" technique that is of interest here is partially-opposed-phase (POP), which acquires 2 echoes with angular separation 0° and approximately 135°. The present invention here is similar, but with improved efficiency and robustness when applied to balanced SSFP imaging, where a refocused opposed-phase acquisition is possible.

SUMMARY OF THE INVENTION

The present invention provides an efficient method for species signal separation that is more accurate than phase-sensitive SSFP, yet significantly faster and simpler than 3-point IDEAL imaging. The technique can provide water/fat separation in balanced SSFP in two acquisitions.

In its simplest embodiment, this technique separates water and fat using two balanced SSFP acquisitions $S_1$ and $S_2$, that have water and fat 180° and 90° out of phase respectively. After phase correction of $S_1$ the water (W) and fat (F) signals can be determined by simply solving a quadratic equation that depends on the magnitude and sign of $S_1$ and the magnitude of $S_2$.

A second embodiment combines this technique with multiple acquisition SSFP to separate water and fat in the presence of off resonance using a total of 4 acquisitions.

The invention and object and features thereof will be more readily apparent from the following detailed description and appended claims when taken with the drawings.

BRIEF DESCRIPTION OF THE DRAWINGS

FIGS. 7(a)–7(c) illustrate sagittal images of a knee showing fat (a), water (b), and recombined images (c).

FIGS. 8(a)–8(c) illustrate coronal images of a knee showing fat (a), Water (b) and recombined images (c).

DETAILED DESCRIPTION OF THE PREFERRED EMBODIMENTS

Figure 1A:
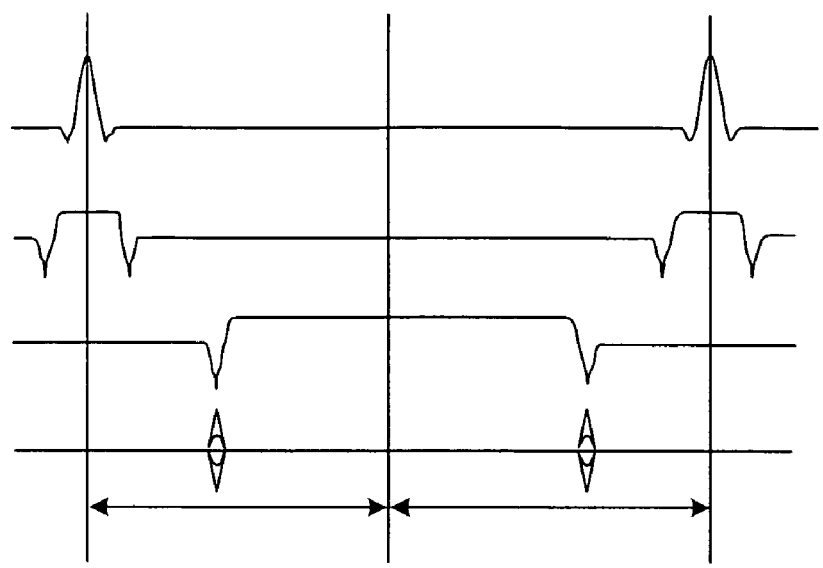
FIGS. 1A, 1B illustrate a SSFP phase sequence in accordance with prior art.
Figure 1B:
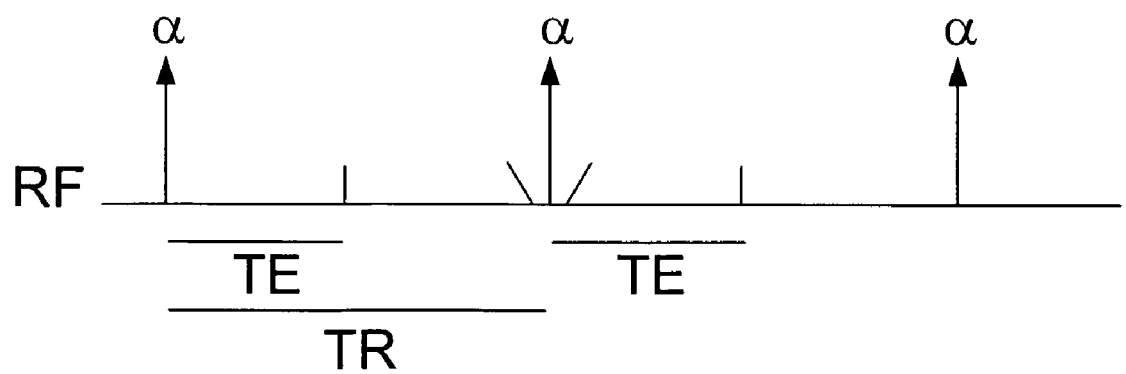
Figure 2:
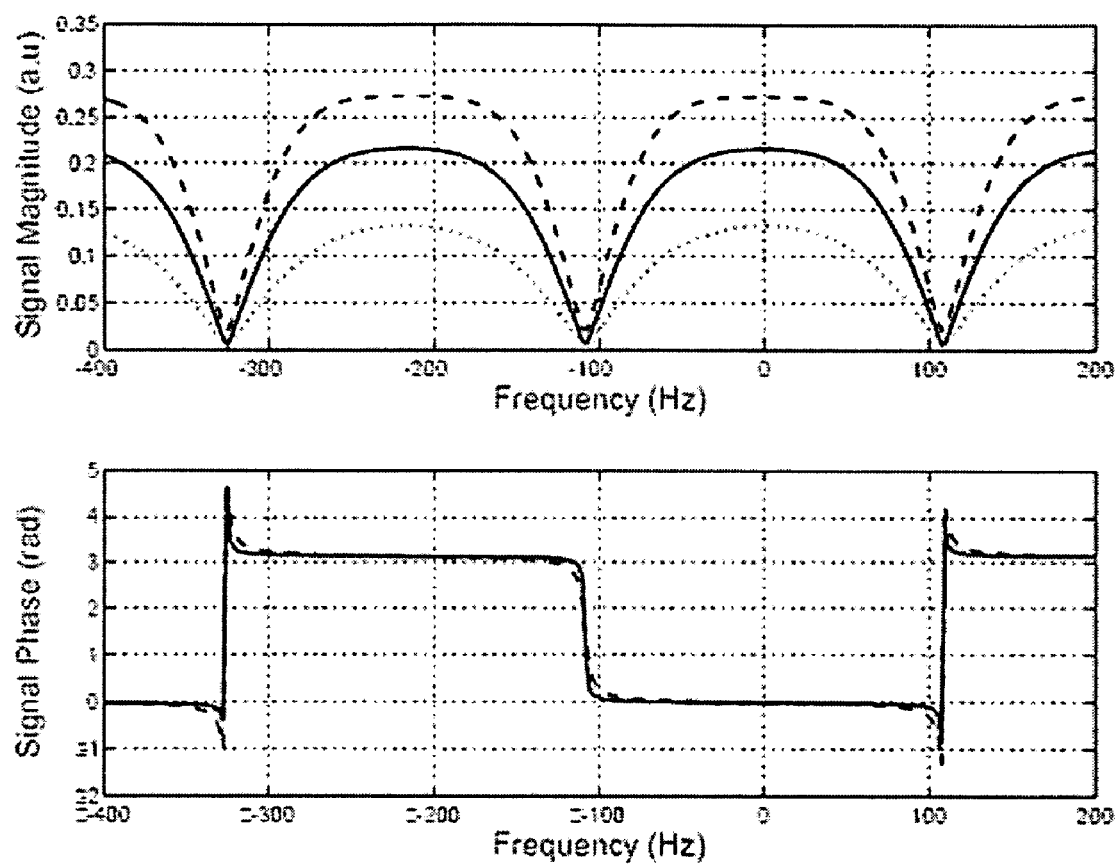
FIG. 2 illustrates magnitude (top) and phase (bottom) of a balanced SSFP signal with TE=TR/2=2.3 ms for different tissues.

In balanced SSFP, the signal from spins in each band of frequencies of width 1/TR is refocused at TE=TR/2, to form a spin echo. The direction of the spin echo alternates by 180° with each frequency increase of 1/TR. This behavior is well documented and is shown in FIG. 2. If TE is not TR/2, then the signal phase is simply the phase at TR/2 plus precession between TE and TR/2.

The selection of $$TR = \frac{2k+1}{\Delta f_{cs}},$$

where k is an integer and $\Delta f_{cs}$ is the chemical shift frequency difference between fat and water, will guarantee that fat and water are always refocused 180° out of phase. (Selection of a TR close to such a value is often sufficient).

Two balanced SSFP images are acquired with TR chosen above, and all parameters kept constant with the exception of TE. For the first image, $TE=TE_1=TR/2$. For the second image, $$TE = TE_2 = TR/2 + \frac{v}{2\pi}/\Delta f_{cs}.$$

Denote the complex signals for the two images as $S_1$ and $S_2$ where $$S_1 = (W-F)e^{i\phi} \quad (1)$$

$$S_2 = (W-e^{iv}F)e^{i\phi}e^{2\pi i(TE_2-TE_1)f} \quad (2)$$

Here W and F are the signal magnitudes from water and fat respectively. $\phi$ is a constant signal phase term resulting from coil phase, slice profile or timing mismatches, and varies slowly in space. f is the frequency corresponding to field inhomogeneity and susceptibility variations, and can vary arbitrarily in space.

Complex images of $S_1$ and $S_2$ are reconstructed using a standard Fourier image reconstruction. First, an estimate, $\hat{\phi}$, of the value of $\phi$ at each voxel is determined. This can be done by assuming that $\phi$ varies slowly in space, and that the sign of W−F can change arbitrarily. Beginning at a voxel known to be water or fat, the phase $\hat{\phi}$ of each voxel or block of voxels moving outwards is found, such that $\hat{\phi}$ differs by less than 90° from that of neighboring blocks or voxels. This scheme has been used for phase-sensitive SSFP and similar schemes have been presented for other Dixon reconstruction approaches.

Given the phase estimate, $\hat{\phi}$, define the water-fat difference estimate as $$\hat{d} = S_1 e^{-i\hat{\phi}} \quad (3)$$

Next, using $\hat{d}$ and the fact that $|S_2|^2 = W^2 + F^2 + 2WF \cos v$, use Eq. 3 to write $$|S_2|^2 \approx (\hat{d}+F)^2 + F^2 + 2(\hat{d}+F)F \cos v \quad (4)$$

This is a simple quadratic equation in F. The desired solution of Eq. 4 gives the estimates of W and F:

$$\hat{F} = -\frac{1}{2}\hat{d}\frac{1}{2}\sqrt{\hat{d}^2 + 2\frac{|S_2|^2 - \hat{d}^2}{1+\cos v}} \quad (5)$$

and $$\hat{W} = \hat{d} + \hat{F} \quad (6)$$

The physical meaning of the lesser root of Eq. 4 is to give $\hat{F}$ as an estimate of −W and $\hat{W}$ as an estimate of −F.

It is useful to note that in the case where $v=\pi/2$, Eq. 5 is simply $$\hat{F} = -\frac{1}{2}\hat{d}\frac{1}{2}\sqrt{2|S_2|^2 - \hat{d}^2} \quad (7)$$

A final, optional step is to calculate an estimate of the field inhomogeneity f (actually in Hz) as:

$$f = \frac{1}{2\pi(TE_2 - TR/2)} \angle \left(S_2 e^{-i\hat{\phi}}(\hat{W} - ie^{iv}\hat{F})\right) \quad (8)$$

However, note that this calculation is not necessary for determination of $\hat{W}$ and $\hat{F}$.

Figure 3:
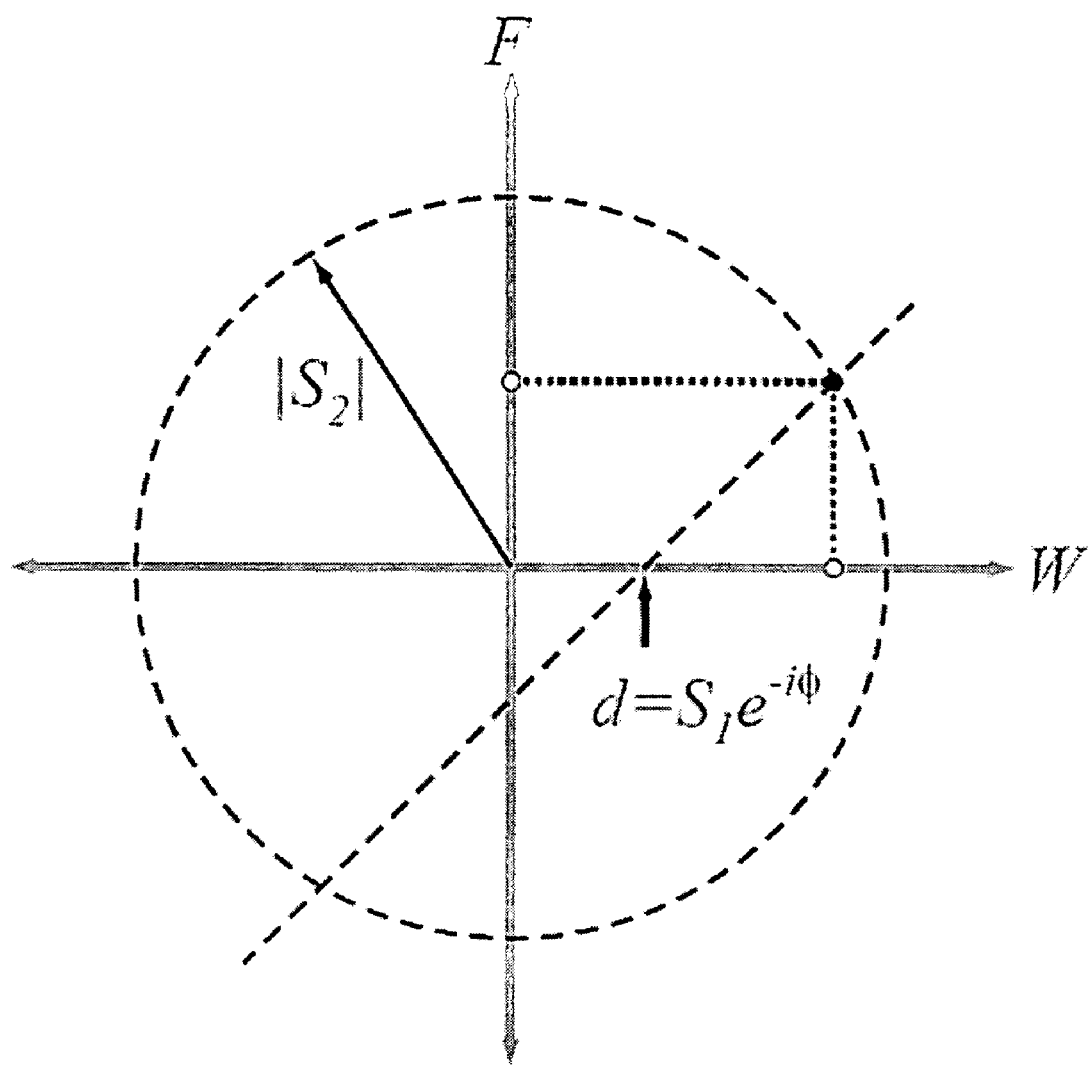
FIG. 3 is a geometric interpretation of signals $S_1$ and $S_2$ in a fat (F) and water (W) coordinate plane.

FIG. 3 shows a geometric interpretation of the reconstruction of F and W from signals $S_1$ and $S_2$ in a FW coordinate plane, for $v=\pi/2$. The point $\hat{d}$ is located on the W axis after removing phase $\hat{\phi}$ from $S_1$, and a line of slope 1 is drawn through this point (thin solid line). A circle centered at the origin, with radius $|S_2|$ (dotted line) is drawn. The intersection of the line with the circle in quadrant 1, shown by the solid dot gives the water ($\hat{W}$) and fat ($\hat{F}$) values, shown by hollow dots. Notice that the other intersection of the line and circle gives negative, interchanged estimates of fat and water.

It is also useful to consider that the water and fat estimates are most accurate when the line and circle intersect at 90°, when F=W. Noise in $|S_2|^2$ will enlarge/reduce the size of the circle, while noise in $\hat{d}$ will shift the line horizontally.

FIG. 3 shows the solution to Eq. 5. The fact that the dependence on $S_2$ gives a circular shape is not because the phase of $S_2$ is unimportant in the fit. When general values of v (other than $\pi/2$) are considered the circle becomes an ellipse that intersects the W and F axes at $|S_2|$. Extreme cases are $v=0$ and $v=\pi$. As v approaches 0, the ellipse approaches a line with slope −1, representing the very simple case where $\hat{F}=\hat{d}/2+|S_2|/2$. As v approaches $\pi$, $S_1$ and $S_2$ become the same, and the ellipse is asymptotic to two lines of slope 1 intersecting the W axis and F axis respectively at $|S_2|$.

Since this method is for use with balanced SSFP imaging, it is useful to consider the effect of crossing a signal null, such as at 110 Hz in FIG. 2. For the purposes of this discussion, assume that TR=4.6 ms.

First assume the voxel is entirely water. The estimate, $\hat{\phi}$ is intentionally insensitive to phase changes of 180°, so is unaffected by the null-crossing. It follows that the sign of $\hat{d}$ is now incorrect, so fat and water will be interchanged. Thus $\hat{F}=W$ and $\hat{W}=F$. Finally, consider the "water frequency" f as determined by Eq. 8. The angle of $S_2$ changes by 180°.

Furthermore, because water and fat are interchanged, the angle of $\hat{W}-ie^{iv}\hat{F}$ decreases by 90°. The net result is a 90° increase in the phase, or a 220 Hz increase in calculated f.

Second, assume the voxel is entirely water. Again, $\hat{\phi}$ is unaffected by the null-crossing and fat and water will be interchanged. The angle of $S_2$ changes by 180°, and the angle of $\hat{W}-ie^{iv}\hat{F}$ increases by 90°. The net result is a 90° decrease in the phase, or a 220 Hz decrease in calculated f.

Third, assume the voxel is split between water and fat. In this case the angle of $S_2$ changes by 180°, while the angle of $\hat{W}-ie^{iv}\hat{F}$ is unchanged. Thus f changes by 440 Hz (±440 Hz are not distinguishable).

It follows that the overall frequency change is greater than 220 Hz. By simply adding 180° to $\hat{\phi}$, fat and water will be correctly identified, and the angle change in $S_2$ will be cancelled.

The fact that water and fat are opposed-phase in $S_1$ is essential to this technique, and in absence of noise allows perfect reconstruction for any value of ν except ν=π. If, however, $S_1$ was acquired with water and fat in phase, the quadratic separation is not possible. This can be seen by replacing the line in FIG. 3 with a line of slope −1, and noting that this line now intersects the circle at two points in the first quadrant. Derivation of Eq. 5 for this case would show that there is an ambiguity in taking the square root, and which root to use. For the opposed-phase case, it is clear that the greater quadratic root is the appropriate solution. As previously stated, the lesser root produces negative, interchanged values of $\hat{W}$ and $\hat{F}$.

Using Matlab 6.5 (Natick, Mass.), a function calculates $S_1(W, F, \phi, f)$, and $S_1(W, F, \phi, f)$, given sequence parameters α (flip angle), TR, $TE_1$, $TE_2$, and the fat/water chemical shift frequency $f_{cs}$.

N "pixels" were simulated, with the values of W and F constant such that W+F=1. $\phi$ was chosen from a uniform distribution between −π/4 and π/4, and f was normally distributed with a mean of 0 Hz and standard deviation of 100 Hz.

For each pixel, $S_1$ and $S_2$ were calculated for TR=4.6 ms, $TE_1$=2.3 ms, $TE_2$=1.15 ms, α=60° and $f_{cs}$=220 Hz. For these parameters, ν=π/2. Next, four random variables, $X_1$, $X_2$, $Y_1$ and $Y_2$ were selected from a Gaussian distribution with a mean of 0 and standard deviation σ for each voxel. To simulate noise, signals $\tilde{S}_1$ and $\tilde{S}_2$ were generated as:

$$\tilde{S}_1 = S_1 + X_1 + iY_1 \quad (9)$$

$$\tilde{S}_2 = S_2 + X_2 + iY_2 \quad (10)$$

To simulate the reconstruction, $\hat{\phi}$ was estimated, assuming a small distribution, from the angle of $\tilde{S}_1$. With this small distribution of $\phi$, the simulation does not really address the detection of $\phi$.

Equations 3, 5 and 6 were used to determine the values of $\hat{W}$ and $\hat{F}$ from $\tilde{S}_1$ and $\tilde{S}_2$. The mean and standard deviation of the detection errors $\hat{W}-S_w$ and $\hat{F}-S_f$ were calculated. Here $S_w$ is the average of $|S_1|$ and $|S_2|$ when W=1 and F=0, i.e. the balanced SSFP signal for an all-water voxel. $S_f$ is, similarly the average of $|S_1|$ and $|S_2|$ when W=0 and F=1.

Figure 4:
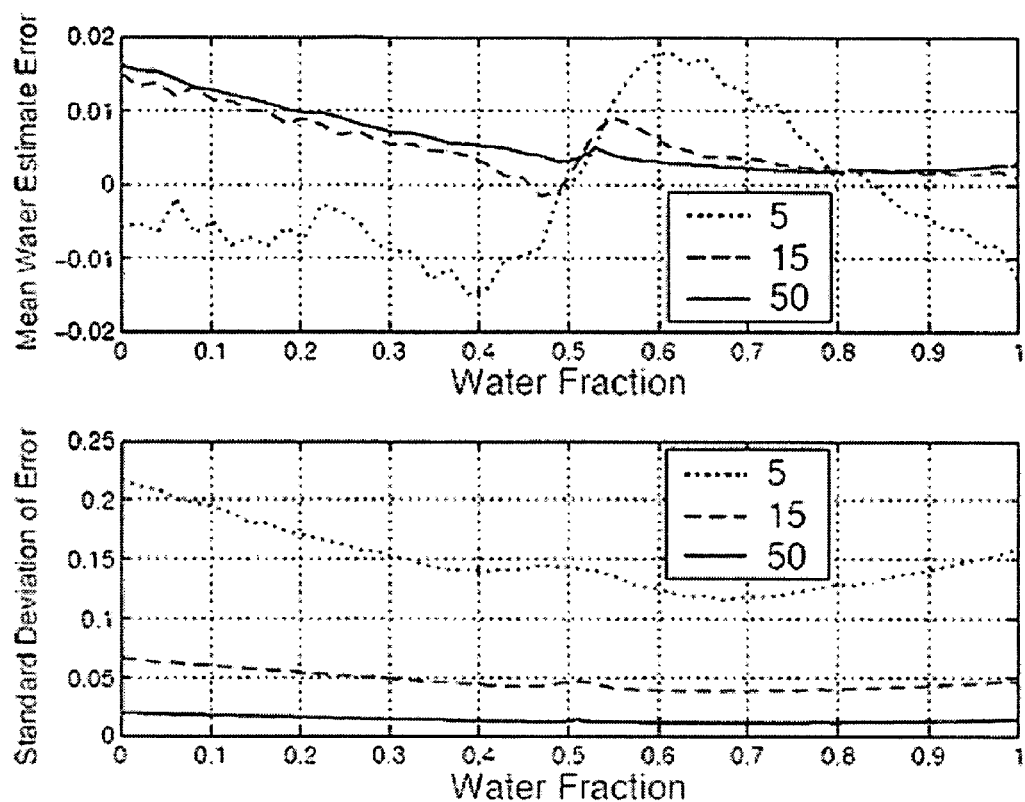
FIG. 4 illustrates mean and standard deviation of a water estimation error ($\hat{W}-S_W$) as a function of water fraction for different SNR values.
Figure 5A:
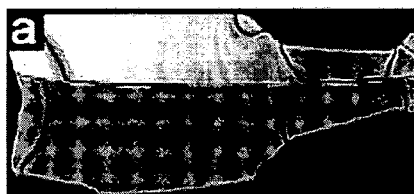
FIGS. 5(a)–5(h) illustrate water/fat separation without the use of a magnetic field map.
Figure 5B:
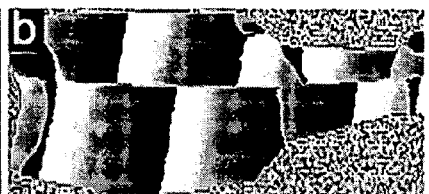
Figure 5C:
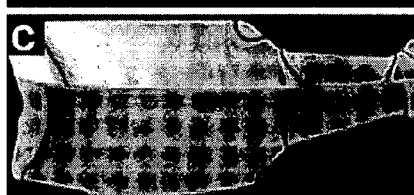
Figure 5D:
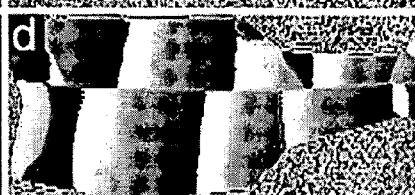
Figure 5E:
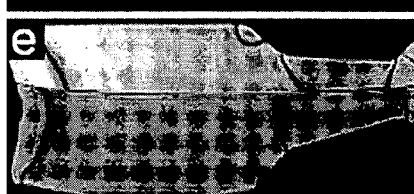
Figure 5F:
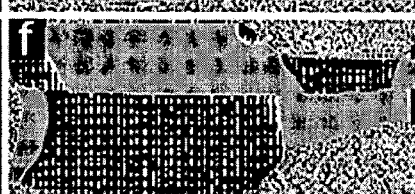
Figure 5G:
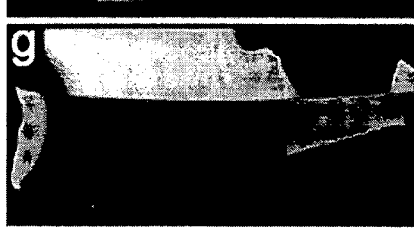
Figure 5H:
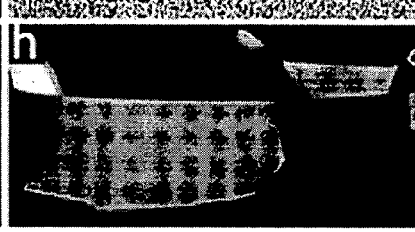

These simulations were repeated for numerous parameter combinations with 0<W<1 and SNR of 5, 15 and 50. FIG. 4 shows the mean and standard deviation of the error in water estimate ($\hat{W}-S_w$) for SNR values of 5, 15 and 50.

Note the trend with mean—due to the fact that the radical in Eq. 5 is forced to be positive. Also, the standard deviation of the estimate is largest when the water fraction is low. This also makes sense because $|S_2|$ is not very sensitive to W when W/F is small (as can be seen from FIG. 3) or the fact that $|S_2|^2=W^2+F^2$).

The experiments to test this method include validation in a fat/water phantom, and in vivo imaging.

We verified this technique using a bottle phantom filled with tap water and vegetable oil, laid on its side. We used a custom 3D balanced SSFP pulse sequence with TR=5.8 ms, $TE_1$=2.9 ms, $TE_2$=1.75 ms, and α=60°. Other scan parameters were a 24×24×9.6 cm³ field of view (FOV) with 256×160×48 matrix, leading to 1.0×1.5×2.0 mm³ voxel size. A small linear gradient shim, approximately 0.038 mT/m, was applied along the bottle to create a linear frequency variation of 16 Hz/cm.

All scans were performed on a 1.5 T GE Signa Excite scanner with 40 mT/m gradients, 150 mT/m/ms gradient slew rates and a quadrature transmit/receive head coil (GE Healthcare, Waukesha, Wis.).

Both acquisitions were reconstructed using a standard Fourier reconstruction to produce images $S_1$ and $S_2$. $\hat{\phi}$ was estimated using a region-growing algorithm, and $\hat{W}$ and $\hat{F}$ were calculated using Equations 3, 5 and 6 were used to determine the water and fat content.

FIG. 5 shows the magnitude and phase images of $S_1$ and $S_2$ for the fat/water phantom, followed by magnitude and phase of $\hat{d}$, and finally the magnitudes of $\hat{W}$ and $\hat{F}$. Images (g) and (h) show that fat and water are correctly separated in the central part of the bottle. In other regions of the bottle, fat and water are incorrectly determined. This is because of the off-resonance sensitivity of balanced SSFP, and emphasizes the need for a good shim and a short TR.

Projection in vertical direction of slanted block across interface. As a preliminary test of the ability of this technique to quantify fat and water content in a single voxel, vertical projections were made through a slanted slab in the images $S_1$ and $S_2$. The slab was chosen to intersect the fat/water boundary in the bottle, so that the water/fat ratio varies with position in the slab. The projected voxels from $S_1$ and $S_2$ were used to calculate $\hat{W}$ and $\hat{F}$ as a function of position along the slab using the same reconstruction as for the 3D images.

Figure 6:
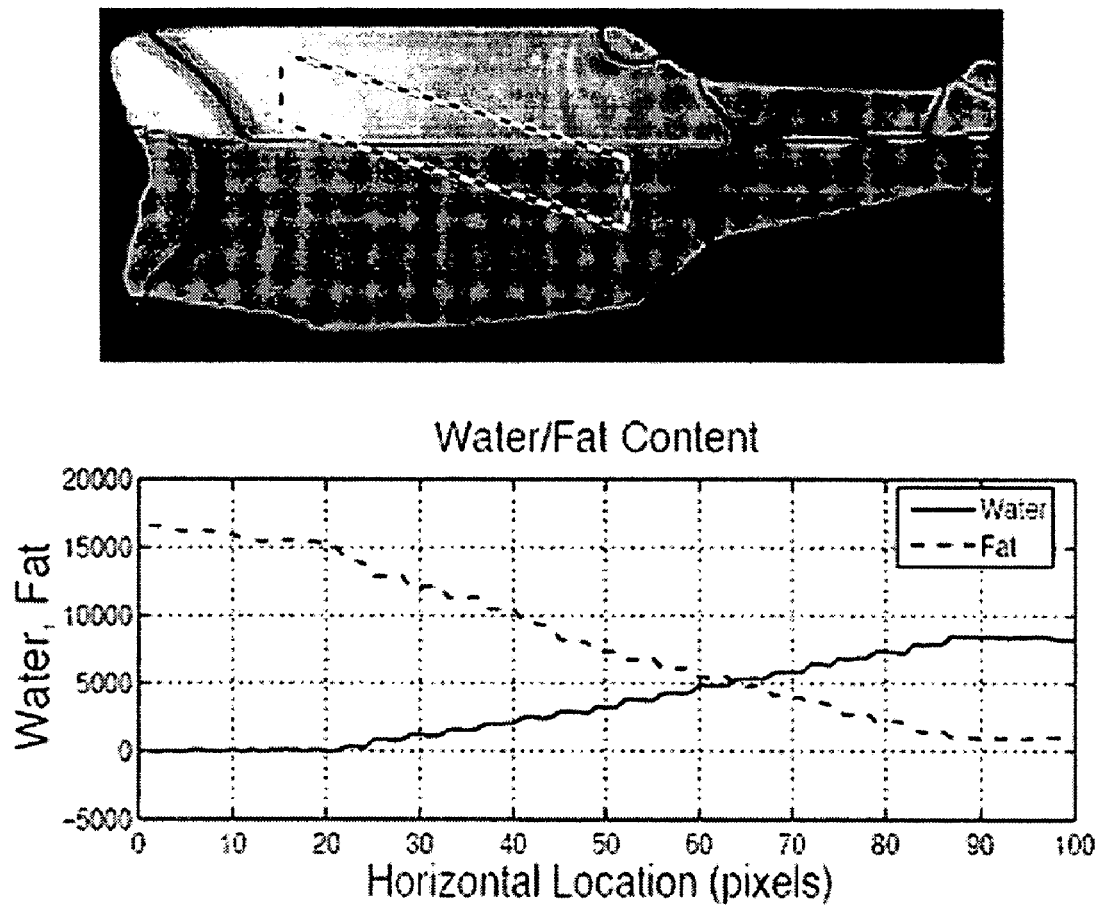
FIG. 6 illustrates fat/water separation through a tilted projection.
Figure 9A:
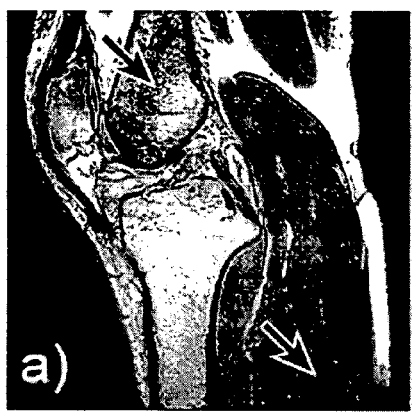
FIGS. 9(a)–9(d) illustrate sagittal knee images for TR=2TE=13.8 ms.
Figure 9B:
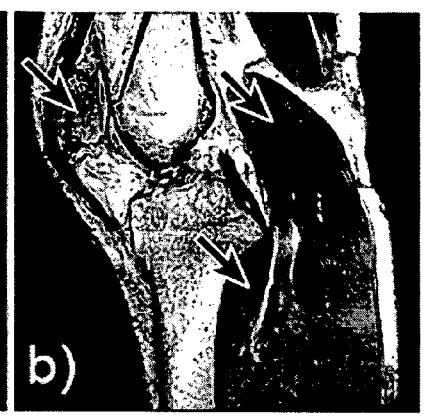
Figure 9C:
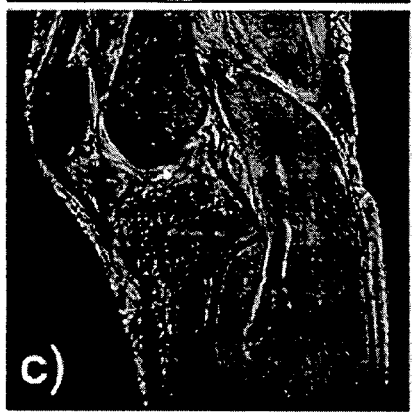
Figure 9D:
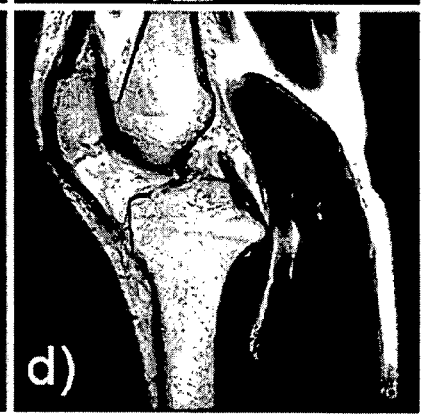

FIG. 6 shows a tilted slab that is used to calculate projected voxels from $S_1$ and $S_2$. The fat and water content in each projected voxel is plotted as a function of position in the lower part of the figure. This is a preliminary illustration of the ability of this algorithm to separate fat and water within a voxel regardless of the water/fat ratio in the voxel.

This technique was tested in vivo by acquisition of 3D balanced SSFP images in the knee of a normal volunteer, using identical parameters as for the phantom scan, except that the matrix size was 160×160×96 matrix, leading to a 1.5×1.5×2.0 mm³ voxel size. No additional shim was applied for this scan, as no field variation is desired.

The scans were performed on a 1.5 T GE Signa Excite scanner with 40 mT/m gradients, 150 mT/m/ms gradient slew rates and a linear transmit/receive extremity coil (GE Healthcare, Waukesha, Wis.). Reconstruction procedure was identical to that used for the phantom scans.

FIGS. 7 and 8 show separated fat and water images and the recombined ($\hat{F}+\hat{W}$) image in the sagittal and coronal planes. Fat and water are well separated, and the presence of a small amount of water in the femur and tibia shows that the technique is able to process voxels containing both fat and water.

As mentioned above, the field map estimate f̂ is not needed for water/fat separation. However, using Eq. 8, f̂ can be determined, and used to detect pixels where crossing of an SSFP signal null has caused an incorrect sign of d̂. Negating d̂ and adding 180° to φ̂ at these points, gives the correct estimates of Ŵ, F̂ and f̂.

This is of particular significance for high-field SSFP or high-resolution SSFP. In these cases the TR is usually too long to avoid SSFP signal nulls, so multiple acquisition methods can be used. The following experiment combines the proposed quadrature separation with the "maximum pixel" multiple acquisition method.

A balanced SSFP protocol with TR=2TE$_1$=13.8 ms and TE$_2$=6.75 ms, and a 30° flip angle was repeated twice, first with RF phase alternating by 180°, then with constant RF phase for a total of 4 image acquisitions. The total scan time was 15:05 for a 256×256×64 matrix over a 16×16×12.8 cm$^3$ FOV. Ŵ, F̂ and f̂ were calculated as above for both phase cycles. At points where f̂ deviated by more than an empirically determined threshold of 140 Hz, d̂ was negated and Ŵ and F̂ were recalculated. Finally, at each pixel, the maximum from the two phase cycles was taken for both Ŵ and F̂ images.

Again, all scans were performed on a 1.5 T GE Signa Excite scanner with 40 mT/m gradients, 150 mT/m/ms gradient slew rates and a linear transmit/receive extremity coil (GE Healthcare, Waukesha, Wis.). Reconstruction procedure was identical to that used for the phantom scans.

FIG. 9 shows the original S$_2$ images with RF phase increments of 0° and 180° to show the SSFP signal nulls that result from the long TR of 13.8 ms. The separated water and fat images following separation and maximum-pixel combination are shown below in the figure. The quadrature separation technique correctly determines the water and fat images, while the multiple-phase-cycle acquisitions allow removal or reduction of the signal nulls.

The above experiments are proof-of-concept that quadratic water/fat separation with balanced SSFP is feasible for in vivo MR imaging. This section discusses some additional areas that will be interesting to explore.

For full-readout Cartesian imaging, selection of TE=TE$_1$=TR/2 is very efficient. However, keeping TR constant with a full readout becomes less efficient as the difference between TE$_2$ and TE$_1$ increases. Although this suggests making TE$_2$ similar to TE$_1$, this will decrease robustness. As indicated by Eqs. 3, 6 and 7, the reconstruction is quite simple when TE$_2$ are chosen so that $\nu = \pi/2$. Examining Eq. 5, when $\pi/2 < \nu < \pi$, the rightmost term under the radical can become large, corresponding to a poorly-conditioned system. Conversely, reduction of $\nu$ toward 0 will improve robustness over the $\nu = \pi/2$ case. Thus the choice of echo times is ultimately a tradeoff between reconstruction robustness and scan efficiency.

As was shown by FIG. 4 the propagation of noise in this reconstruction is not simple. First, the propagation of noise is improved when phase-correcting S$_1$, assuming the correction is accurate, since the correction removes any noise that is in quadrature with the signal. Second, using the magnitude of S$_2$ changes the noise statistics from Rayleigh to Rician. Third, examining FIG. 3, the quadratic solution for F̂ is less sensitive to noise when the line and circle intersect at right angles. Thus, the effect of noise will depend on the water/fat ratio. Finally, the selection of TE$_2$, and thus $\nu$ will change the circle in FIG. 3 to an ellipse and affect this intersection angle. While a full analysis of these noise effects is beyond the scope of the current description, it is clear from simulations that the SNR is somewhere between that expected for a single acquisition and two acquisitions.

The use of phased-array coils for SNR improvement is of significance in MR. For a multicoil non-accelerated reconstruction, this method can generate phase maps for individual coils at the phase-correction stage. Once the appropriate phase maps have been generated, other steps of the reconstruction can be performed individually for each coil, and final images combined.

Parallel imaging techniques use individual coil sensitivity information to accelerate imaging. We have previously shown that phase-sensitive SSFP can be implemented following a sensitivity-encoded (SENSE) reconstruction that preserves image phase (See Vasanawala S S, et al. "Phase-sensitive SSFP parallel imaging," Proceedings of the 12th Annual Meeting of ISMRM, Kyoto, 2004. p. 2253.). A similar reconstruction applied to individual coil signals can produce the S$_1$ and S$_2$ signals needed for quadrature reconstruction. Thus this technique will be compatible with accelerated imaging methods.

Partial k-space acquisitions can reduce scan times by close to 50%, but introduce an unwanted quatrature signal component that can be suppressed in some cases using homodyne reconstruction or other techniques. Because water and fat are 180° out of phase in S$_1$, partial k-space reconstruction can, in principle be performed perfectly, as the signal introduced by partial k-space acquisition is in quadrature with both water and fat. However, the same cannot be said for S$_2$. In fact, even with perfect field homogeneity, a partial k-space acquisition of S$_2$ cannot be properly reconstructed if water and fat are assumed to vary with high spatial frequency. Some advanced techniques or assumptions of slow variation between water and fat may permit a partial acquisition of S$_2$. However, with existing reconstruction methods, a reduction of only 25% in overall scan time is achievable using a partial k-space acquisition.

Quadratic water/fat separation is a promising new method for use with balanced SSFP imaging that exploits the refocusing properties of balanced SSFP, which previous techniques do not. Although similar to Dixon techniques, it requires only two, rather than three, acquisitions and does not require a field map to quantify water and fat.

While the invention has been described with reference to specific embodiments, the description is illustrative of the invention and is not to be construed as limiting the invention. Various applications may occur to those skilled in the art without departing from the spirit and scope of the invention as defined by the appended claims.

What is claimed is:

1. A method of separating MRI signals (Sp1, Sp2) from two species in an object being imaged comprising the steps of:
   a) acquiring MRI signals (S$_1$, S$_2$) using two balanced SSFP acquisitions in which the two species are at respective phase differences, φ and ν, and in which echo times TE$_1$ and TE$_2$ differ, with $S_1 = (S_{p1} - S_{p2})e^{i\phi}$ $S_2 = (S_{p1} - e^{i\nu}S_{p2})e^{i\phi}e^{2\pi i(TE_2 - TE_1)f}$ where f is a frequency corresponding to field inhomogeniety and susceptibility variations, b) estimating a phase, φ̂, for voxels in a field of view, and defining species differences as $\hat{d} = Sp1 - Sp2 = S_1 e^{-i\hat{\phi}}$, and c) using a quadratic expression $$|S_2|^2 = S_{p1}^2 + S_{p2}^2 + 2S_{p1} \cdot S_{p2} \cos \nu$$

and substituting species difference, $\hat{d}$, estimating $$\hat{S}_{p2} = -\frac{1}{2}\hat{d} + \frac{1}{2}\sqrt{\hat{d}^2 + 2\frac{|S_2|^2 - \hat{d}^2}{1+\cos\nu}} \text{ and } \hat{S}_{p1} = \hat{d} + \hat{S}_{p2}.$$

2. The method of claim 1 wherein the two species are water and fat with signal magnitude W and F, respectively.

3. The method of claim 2 where first echo time, TE1, is one-half repetition time, TR/2, and the second echo time, $$TE2 \text{ is } TR/2 + \frac{\nu}{2\pi}\Delta f_{cs},$$

where ν is phase difference between water signals and fat signals in the second acquisition, and $\Delta f_{cs}$ is chemical shift frequency difference between water and fat.

4. The method of claim 3 wherein phase difference between fat and water in $S_1$ is 180° and in $S_2$ is 90°.

5. The method of claim 4 wherein $$\hat{F} = -\frac{1}{2}\hat{d} + \frac{1}{2}\sqrt{2|S_2|^2 - \hat{d}^2}.$$

6. The method of claim 5 where a field map is calculated after estimating the two species.

7. The method of claim 6 where species and field map estimates are calculated using reduced-resolution images to reduce imaging time.

8. The method of claim 1 wherein S1 and S2 are acquired multiple times with different phase increments in SSFP to reduce the effects of dark bands.

9. The method of claim 1 wherein multiple coils are used, and the coil sensitivities are used to reconstruct signals S1 and S2 for different coils or combinations of coils.

10. The method of claim 1 where signals S1 and S2 are both acquired in a "multi-echo" sequence, using a single RF excitation.

11. The method of claim 1 where S1 is acquired using a pulse sequence that results in water and fat being opposed-phase.

12. The method of claim 1 where TE1=(2k+1)/(2$f_{cs}$) where k is an integer and $f_{cs}$ is the frequency difference between species.

* * * * *